US012622160B2

(12) United States Patent　　　(10) Patent No.:　　US 12,622,160 B2
Lius　　　(45) Date of Patent:　　　May 5, 2026

(54) DISPLAY DEVICE

(71) Applicant: Innolux Corporation, Miaoli County (TW)

(72) Inventor: Chandra Lius, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 598 days.

(21) Appl. No.: 18/165,939

(22) Filed: Feb. 8, 2023

(65) Prior Publication Data

US 2023/0320180 A1　　　Oct. 5, 2023

(30) Foreign Application Priority Data

Mar. 29, 2022　　(CN) .......................... 202210317597.7

(51) Int. Cl.
　H10K 59/80　　　(2023.01)
　H10K 59/38　　　(2023.01)
(52) U.S. Cl.
　CPC ........... H10K 59/879 (2023.02); H10K 59/38 (2023.02)
(58) Field of Classification Search
　CPC .... H10K 59/879; H10K 59/38; H10K 59/122; H10K 59/352; H10K 59/353; H10K 59/8792
　See application file for complete search history.

(56) References Cited

U.S. PATENT DOCUMENTS

2013/0002690 A1 *　1/2013　Ichinose .............. H10K 59/879
　　　　　　　　　　　　　　345/522
2021/0202664 A1 *　7/2021　Kim ..................... H10K 59/131

2021/0202917 A1 *　7/2021　Lee ...................... H10K 59/122
2022/0376006 A1 *　11/2022　Li ......................... H10K 50/858
2023/0180586 A1 *　6/2023　Wang ................... H10K 59/879
　　　　　　　　　　　　　　257/91
2023/0317894 A1 *　10/2023　Nakamura ......... H10H 20/8514
　　　　　　　　　　　　　　257/98

FOREIGN PATENT DOCUMENTS

CN　　102293052　　　12/2011
CN　　102293052 A　* 12/2011　........... G02B 3/0068
WO　　2022038452　　　2/2022

OTHER PUBLICATIONS

"Office Action of Taiwan Counterpart Application", issued on Jun. 27, 2023, p. 1-p. 5.

* cited by examiner

*Primary Examiner* — S M Sohel Imtiaz
(74) *Attorney, Agent, or Firm* — JCIPRNET

(57) ABSTRACT

A display device includes a substrate, a first light-emitting unit, and a first lens. The first light-emitting unit is disposed on the substrate and configured to emit a first light beam. The first lens is disposed on the first light-emitting unit and configured to receive at least a portion of the first light beam. In a cross-sectional view of the display device, the first light-emitting unit has a first width W1, the first lens has a second width W2, the first lens has a height L, the first lens has a radius of curvature R, a distance between the first lens and the first light-emitting unit is T, and the display device satisfies:

$$\frac{T}{(W2-W1)/2} \le \frac{57.29 + \dfrac{2*(R-L)}{W_2}}{1 - \dfrac{114.58*(R-L)}{W_2}};$$

$0.1\ \mu m \le (W2-W1)/2 \le 30\ \mu m$; and $R \ge L$.

10 Claims, 11 Drawing Sheets

1

DISPLAY DEVICE

CROSS-REFERENCE TO RELATED APPLICATION

This application claims the priority benefit of China application serial no. 202210317597.7, filed on Mar. 29, 2022. The entirety of the above-mentioned patent application is hereby incorporated by reference herein and made a part of this specification.

BACKGROUND

Field of the Disclosure

The disclosure relates to an electronic device, in particular to a display device.

Description of Related Art

In a display device, a portion of the light beam is reflected, refracted, absorbed, or the like in the display device and cannot be output from the display device. Therefore, how to improve the light extraction efficiency of the display device has become one of the research and development priorities of display techniques.

SUMMARY

The disclosure provides a display device having good light extraction efficiency.

According to an embodiment of the disclosure, a display device includes a substrate, a first light-emitting unit, and a first lens. The first light-emitting unit is disposed on the substrate and configured to emit a first light beam. The first lens is disposed on the first light-emitting unit and configured to receive at least a portion of the first light beam. In a cross-sectional view of the display device, the first light-emitting unit has a first width $W1$, the first lens has a second width $W2$, the first lens has a height $L$, the first lens has a radius of curvature $R$, a distance between the first lens and the first light-emitting unit is $T$, and the display device satisfies:

$$\frac{T}{(W2-W1)/2} \le \frac{57.29 + \dfrac{2*(R-L)}{W_2}}{1 - \dfrac{114.58*(R-L)}{W_2}};$$

$0.1 \ \mu m \le (W2-W1)/2 \le 30 \ \mu m$; and $R \ge L$.

According to an embodiment of the disclosure, a display device includes a substrate, a first light-emitting unit, a second light-emitting unit, a third light-emitting unit, a first lens, a second lens, and a third lens. The first light-emitting unit is disposed on the substrate and configured to emit a blue light beam. The second light-emitting unit is disposed on the substrate and adjacent to the first light-emitting unit. The second light-emitting unit is configured to emit a green light beam. The third light-emitting unit is disposed on the substrate and adjacent to the second light-emitting unit. The third light-emitting unit is configured to emit a red light beam. The first lens is disposed on the first light-emitting unit and configured to receive at least a portion of the blue light beam. The second lens is disposed on the second light-emitting unit and configured to receive at least a portion of the green light beam. The third lens is disposed on the third light-emitting unit and configured to receive at least a portion of the red light beam. A distance between the first lens and the third lens is greater than a distance between the first lens and the second lens.

In order to make the above features and advantages of the disclosure better understood, embodiments are specifically provided below with reference to figures for detailed description as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
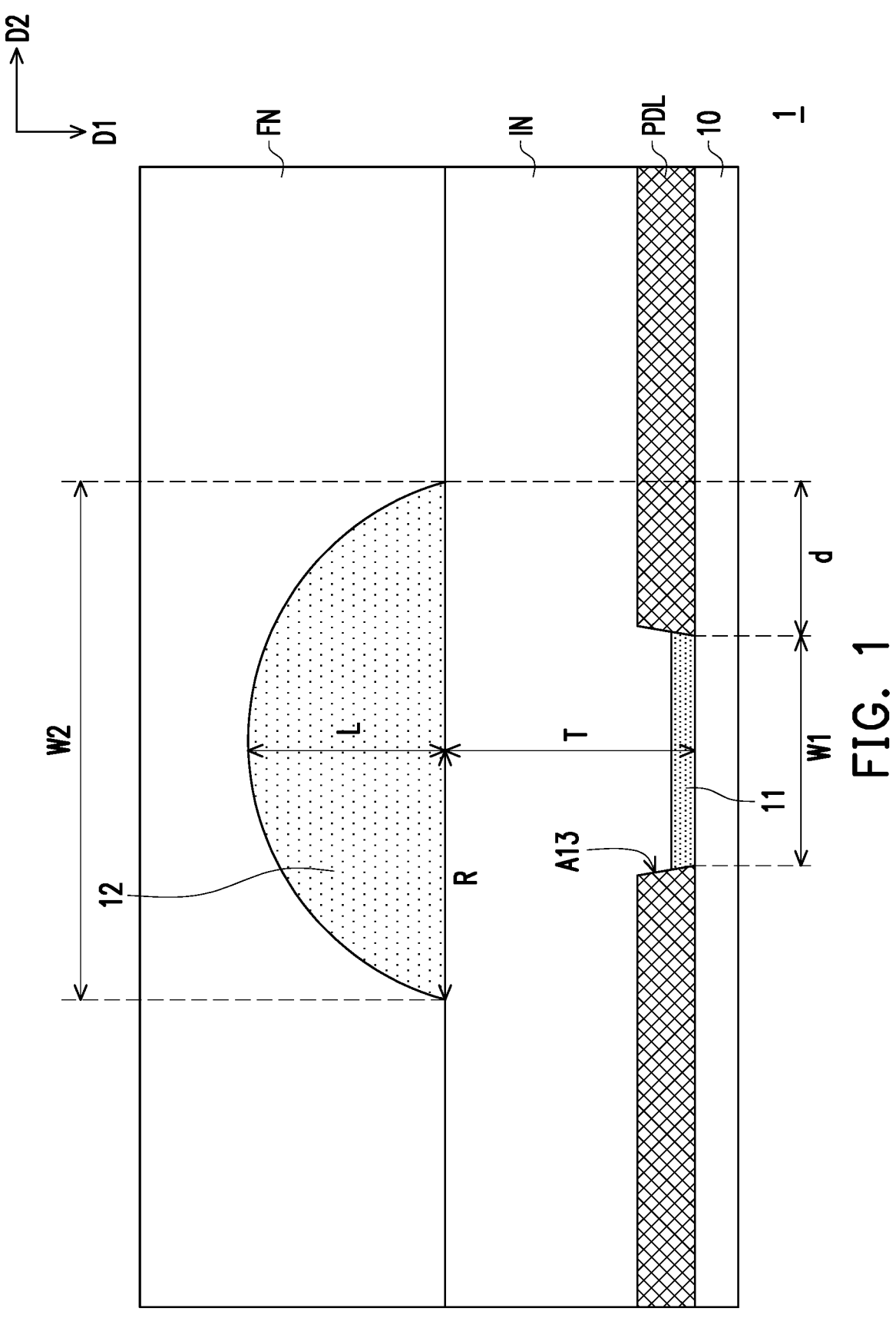
FIG. 1, FIG. 2, and FIG. 8 to FIG. 11 are respectively partial cross-sectional schematic diagrams of display devices according to a plurality of embodiments of the disclosure.

Hereinafter, reference will be made in detail to exemplary embodiments of the disclosure, and examples of the exemplary embodiments are illustrated in the figures. Wherever possible, the same reference numerals are used in the figures and the descriptions to refer to the same or similar portions.

Certain terms are used throughout the specification and the appended claims of the disclosure to refer to particular elements. Those skilled in the art should understand that electronic device manufacturers may refer to the same elements under different names. This article is not intended to distinguish between elements having the same function but different names. In the following description and claims, the words "including" and "containing" and the like are open words, so they should be interpreted as meaning "including but not limited to . . . ."

The terminology mentioned in the specification, such as: "up", "down", "front", "rear", "left", "right", etc., are directions referring to the drawings. Therefore, the directional terms used are used for illustration, not for limiting the disclosure. In the drawings, each drawing depicts general features of methods, structures, and/or materials used in specific embodiments. However, these drawings should not be construed to define or limit the scope or nature covered by these embodiments. For example, for clarity, the relative size, thickness, and position of each film, region, and/or structure may be reduced or enlarged.

One structure (or layer, element, substrate) described in the disclosure being located on/above another structure (or layer, element, substrate) may mean that the two structures are adjacent and directly connected, or it may mean that the two structures are adjacent rather than directly connected. Indirect connection means that there is at least one intermediate structure (or intermediate layer, intermediate element, intermediate substrate, intermediate space) between the two structures. The lower surface of one structure is adjacent or directly connected to the upper surface of the intermediate structure, and the upper surface of the other structure is adjacent or directly connected to the lower surface of the intermediate structure. The intermediate structure may be formed by a single-layer or multi-layer physical structure or a non-physical structure without limitation. In the disclosure, when a certain structure is disposed "on" another structure, it may mean that a certain structure is "directly" on the other structure, or that a certain structure is "indirectly" on the other structure. That is, at least one structure is further sandwiched between the certain structure and the other structure.

The terms "about", "equal to", "equal" or "identical", "substantially" or "roughly" are generally interpreted as being within 20% of a given value or range, or interpreted as being within 10%, 5%, 3%, 2%, 1%, or 0.5% of a given value or range.

The ordinal numbers used in the specification and claims, such as "first", "second", etc., are used to modify an element. They do not themselves imply and represent that the element(s) have any previous ordinal number, and also do not represent the order of one element and another element, or the order of manufacturing methods. The use of these ordinal numbers is to clearly distinguish an element with a certain name from another element with the same name. The same terms may not be used in the claims and the specification, and accordingly, the first component in the specification may be the second component in the claims.

The electrical connection or coupling described in the disclosure may refer to direct connection or indirect connection. In the case of direct connection, the endpoints of the elements on two circuits are directly connected or connected to each other by a conductive line segment. In the case of indirect connection, there are switches, diodes, capacitors, inductors, resistors, other suitable elements, or a combination of the elements between the endpoints of the elements on the two circuits, but the disclosure is not limited thereto.

In the present disclosure, the thickness, length, and width may be measured using an optical microscope (OM), and the thickness or width may be measured from a cross-sectional image in an electron microscope, but the disclosure is not limited thereto. In addition, there may be a certain error in any two values or directions for comparison. In addition, the terms "equivalent", "equal", "same", "substantially", or "essentially" mentioned in the disclosure usually represent within 10% of a given value or range. In addition, the phrases "the given range is from a first numerical value to a second numerical value" and "the given range falls within the range of a first numerical value to a second numerical value" mean that the given range contains the first numerical value, the second numerical value, and other values in between. If the first direction is perpendicular to the second direction, the angle between the first direction and the second direction may be between 80 degrees and 100 degrees. If the first direction is parallel to the second direction, the angle between the first direction and the second direction may be between 0 degrees and 10 degrees.

It should be noted that in the following embodiments, the features in several different embodiments may be replaced, recombined, and mixed to complete other embodiments without departing from the spirit of the disclosure. As long as the features between the embodiments do not violate the spirit of the disclosure or conflict with each other, they may be mixed and used arbitrarily.

Unless otherwise defined, all terms (including technical and scientific terms) used herein have the same meaning as commonly understood by those skilled in the art to which the disclosure belongs. It should be understood that, these terms, such as those defined in commonly used dictionaries, should be interpreted as having meaning consistent with the relevant technique and the background or context of the disclosure, and should not be interpreted in an idealized or excessively formal way, unless specifically defined in an embodiment of the disclosure.

In the disclosure, an electronic device may include a display device, a backlight device, an antenna device, a sensing device, or a tiling device, but the disclosure is not limited thereto. The electronic device may be a bendable or flexible electronic device. The display device may be a non-self-luminous type display device or a self-luminous type display device. The antenna device may be a liquid-crystal type antenna device or a non-liquid-crystal type antenna device, and the sensing device may be a sensing device sensing capacitance, light, heat, or ultrasound, but the disclosure is not limited thereto. In the disclosure, the electronic device may include an electronic element, and the electronic element may include a passive element and an active element, such as a capacitor, a resistor, an inductor, a diode, a transistor, and so on. The diode may include a light-emitting diode or a photodiode. The tiling device may be, for example, a display tiling device or an antenna tiling device, but the disclosure is not limited thereto. It should be noted that the electronic device may be any combination of the foregoing, but the disclosure is not limited thereto. The following uses a display device as an electronic device or a tiling device to explain the content of the disclosure, but the disclosure is not limited thereto.

It should be noted that the technical solutions provided by the different embodiments below may be used interchangeably, combined, or mixed to form another embodiment without violating the spirit of the disclosure.

FIG. 1, FIG. 2, and FIG. 8 to FIG. 11 are respectively partial cross-sectional schematic diagrams of display devices according to a plurality of embodiments of the disclosure. FIG. 3 to FIG. 7 are respectively partial top schematic diagrams of display devices according to a plurality of embodiments of the disclosure.

Figure 2:
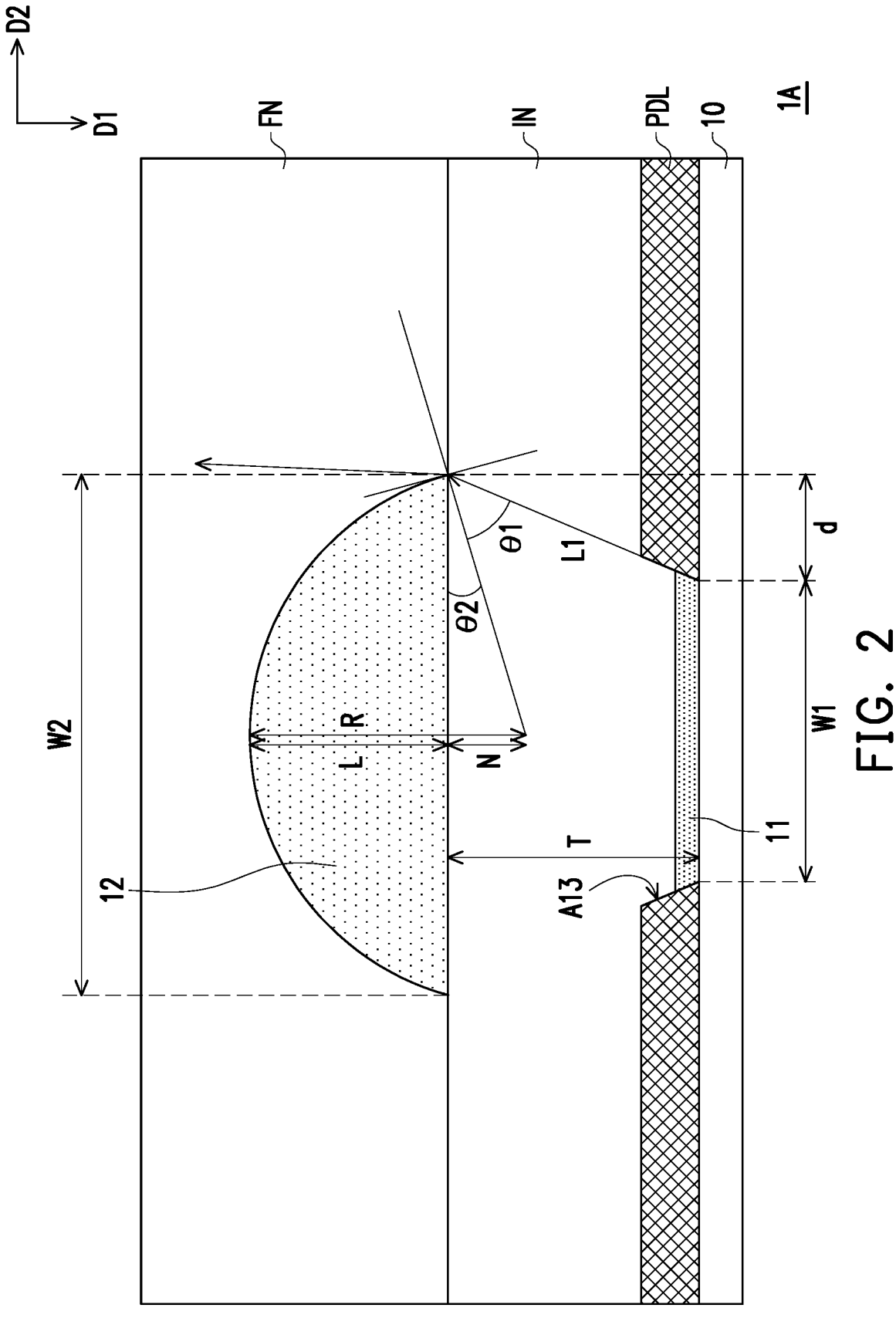

Referring to FIG. 1 or FIG. 2, a display device 1 or a display device 1A may include a substrate 10, a first light-emitting unit 11, and a first lens 12, but the disclosure is not limited thereto. According to different requirements, the display device 1 or the display device 1A may also include other elements or film layers. For example, the display device 1 or the display device 1A may further include a pixel definition layer PDL, an insulating layer IN, and a filling layer FN, but the disclosure is not limited thereto.

The substrate 10 may be a rigid substrate or a flexible substrate. The material of the substrate 10 includes, but not limited to, glass, quartz, ceramic, sapphire, or plastic, for example. In some embodiments, the substrate 10 may be a flexible substrate, and the material of the substrate 10 may include polycarbonate (PC), polyimide (PI), polypropylene (PP), polyethylene terephthalate (PET), other suitable flexible materials, or a combination of the above materials, but the disclosure is not limited thereto. In addition, the light transmittance of the substrate 10 is not limited, that is, the substrate 10 may be a light-transmitting substrate, a semi-light-transmitting substrate, or a non-light-transmitting substrate.

The pixel definition layer PDL is disposed on the substrate 10. The pixel definition layer PDL may be formed of an organic material, such as a light-transmitting polymer material or a non-light-transmitting polymer material. The light-transmitting polymer material may include transparent resin. The non-light-transmitting polymer material may include black resin, white resin (such as resin added with a titanium dioxide particle), or gray resin, but the disclosure is not limited thereto. The pixel definition layer PDL may have an opening A13 exposing the substrate 10.

The first light-emitting unit 11 is disposed on the substrate 10 and, for example, is disposed in the opening A13. The first light-emitting unit 11 is configured to emit a first light beam L1. The first light-emitting unit 11 may include any type of light-emitting element, such as a light-emitting diode (LED), an organic light-emitting diode (OLED), a micro LED and a mini LED, or a quantum dot LED (QLED or QD-LED), but the disclosure is not limited thereto. The first light beam L1 emitted by the first light-emitting unit 11 may be blue light, green light, red light, or visible light or invisible light of other colors.

The insulating layer IN is disposed on the pixel definition layer PDL and covers the first light-emitting unit 11. The material of the insulating layer IN may include an inorganic material, an organic material, or a combination thereof. For example, the insulating layer IN may include a single-layer inorganic insulating layer, stacked layers of a plurality of inorganic insulating layers, a single-layer organic insulating layer, stacked layers of a plurality of organic insulating layers, or stacked layers of at least one inorganic insulating layer and at least one organic insulating layer. The inorganic material may include, but not limited to, silicon oxide (SiOx) or silicon nitride (SiNx). The organic material may include polymethyl methacrylate (PMMA), epoxy resin, acrylic-based resin, silicone, or polyimide polymer, but the disclosure is not limited thereto.

The first lens 12 is disposed on the first light-emitting unit 11 and, for example, is disposed on the insulating layer IN. The first lens 12 may be at least partially overlapped with the first light-emitting unit 11 in a top view direction of the display device 1 (e.g., a direction D1). In other embodiments, the first lens 12 may be directly disposed on the first light-emitting unit 11.

The first lens 12 is configured to receive at least a portion of the first light beam L1. The first lens 12 is an optical element that may change the traveling path of the light beam. As shown in FIG. 1 or FIG. 2, the first lens 12 may include a hemispherical condenser lens. Hemispherical generally refers to a non-complete sphere, and is not limited to half of a sphere. The material of the first lens may include a polymer material, such as an acrylic-based polymer, a siloxane-based polymer, or an epoxy-based polymer, but the disclosure is not limited thereto.

The filling layer FN is disposed on the insulating layer IN and covers the first lens 12. The material of the filling layer FN may include a polymer material, such as an acrylic-based polymer, a siloxane-based polymer, or an epoxy-based polymer, but the disclosure is not limited thereto. The material of the filling layer FN may be the same as or different from the material of the first lens 12. If the materials of the filling layer FN and the first lens 12 are the same, the refractive indices of the filling layer FN and the first lens 12 may be different via the adjustment of process parameters.

If the refractive index of the first lens 12 is n1, the refractive index of the filling layer FN is n2, and the refractive index of the insulating layer IN is n3, then when $n1>n2$ and $n1>n3$ are satisfied, the proportion of the first light beam L1 that may not be output from the display device 1 or the display device 1A may be reduced, thereby improving light extraction efficiency. That is to say, the first light beam L1 emitted by the light-emitting unit 11 may change the traveling direction via the first lens 12 and travel in the normal direction of the substrate 10 as far as possible, so as to improve brightness.

In a cross-sectional view of the display device 1 or the display device 1A, the first light-emitting unit 11 has a first width W1, the first lens 12 has a second width W2, the first lens 12 has a height L, the first lens 12 has a radius of curvature R, and the distance between the first lens 12 and the first light-emitting unit 11 is T. The distance between the edge of the first light-emitting unit 11 and the edge of the first lens 12 is d.

The cross-sectional view of the display device 1 or the display device 1A is a cross-section through the center of the first lens 12 in which the light-emitting region of the first light-emitting unit 11 has the largest width. The first width W1 is defined as the width of the light-emitting region in the light-emitting element on the cross-section. Taking an organic light-emitting diode as an example, as shown in FIG. 1 or FIG. 2, the first width W1 is the bottom width of the opening A13 of the pixel definition layer PDL. Taking a light-emitting diode as an example, although not shown, the first width W1 is the width of a multiple quantum well layer. The second width W2 is defined as the bottom width of the first lens 12 on the cross section. The height L is defined as the largest height of the first lens 12 on the cross-section. The radius curvature R is defined as the radius of curvature of the profile of the first lens 12 on the cross section. The distance T is defined as the smallest distance between the first lens 12 and the bottom of the first light-emitting unit 11 in the normal direction (direction parallel to the direction D1) of the substrate 10 on the cross section. If the first light-emitting unit 11 is an organic light-emitting diode as an example, the bottom of the first light-emitting unit 11 is the bottom of the light-emitting layer, that is, where the light-emitting layer is in contact with the anode, and the distance d is the smallest distance between the edge of the first light-emitting unit 11 and the edge of the first lens 12 in the direction perpendicular to the normal direction of the substrate 10 (e.g., a direction D2) on the cross section, and $d=(W2-W1)/2$.

In some embodiments, as shown in FIG. 1 and FIG. 2, via the design that $R \geq L$, the large-angle first light beam L1 emitted from the first light-emitting unit 11 may be refracted by the first lens 12 and emitted from the first lens 12, thereby helping to improve light extraction efficiency or luminous brightness. In some embodiments, if $0<L \leq 0.75R$ is satisfied, light extraction efficiency may be further improved. Moreover, when $R=L$ (refer to FIG. 1), the first lens 12 may also condense the large-angle first light beam emitted from the first light-emitting unit 11 to the center, so as to further improve front viewing angle brightness. On the other hand, if $R<L$, in addition to the reduced coverage area of the first lens 12, the large-angle first light beam is prone to total internal reflection (TIR) in the first lens 12 and may not be emitted from the first lens 12.

In some embodiments, as shown in FIG. 1 and FIG. 2, the design that the second width W2 is greater than the first width W1 helps the first lens 12 to receive most of the first light beam L1 emitted from the first light-emitting unit 11. For example, $0.1 \ \mu m \leq (W2-W1)/2 \leq 30 \ \mu m$, that is, $0.1 \ \mu m \leq d \leq 30 \ \mu m$. In some embodiments, for example, when the display device has a medium-low resolution of 400 ppi or less, the display device may satisfy $0.5 \ \mu m \leq (W2-W1)/2 \leq 15 \ \mu m$, so as to further improve light extraction efficiency. In some other embodiments, for example, when the display device has a high resolution of 500 ppi or more, the display device may satisfy $0.5 \ \mu m \leq (W2-W1)/2 \leq 9.5 \ \mu m$, so as to further improve light extraction efficiency.

Please refer to FIG. 2, $N=R-L$, $\tan \theta 2=N/(W2/2)=2*N/W2$. If $\theta 1+\theta 2=\theta$ and $\tan \theta=T/d$, since $\tan \theta=\tan(\theta 1+\theta 2)=(\tan \theta 1+\tan \theta 2)/(1-\tan \theta 1*\tan \theta 2)$, $T/d=(\tan \theta 1+\tan \theta 2)/(\tan \theta 1*\tan \theta 2)=(\tan \theta 1+2*N/W)/(1-\tan \theta 1*2*N/W2)$. Since the second width W2 is greater than the first width W1, $\theta 1 \leq 89°$, that is, tan θ1≤tan 89°, so tan θ1≤57.29. This is substituted into T/d=(tan θ1+tan θ2)/(1−tan θ1*tan θ2)=(tan θ1+2*N/W2)/(1−tan θ1*2*N/W2) to get the following equation. When the display device satisfies the following equation, in addition to allowing the first light beam L1 to enter the first lens 12, the probability that the first light beam L1 may not be emitted from the first lens 12 due to total internal reflection in the first lens 12 may be reduced, thereby helping to improve light extraction efficiency.

$$\frac{T}{d} \leq \frac{57.29 + \dfrac{2*(R-L)}{W_2}}{1 - \dfrac{114.58*(R-L)}{W_2}},$$

that is $$\frac{T}{(W2-W1)/2} \leq \frac{57.29 + \dfrac{2*(R-L)}{W_2}}{1 - \dfrac{114.58*(R-L)}{W_2}};$$

Figure 3:
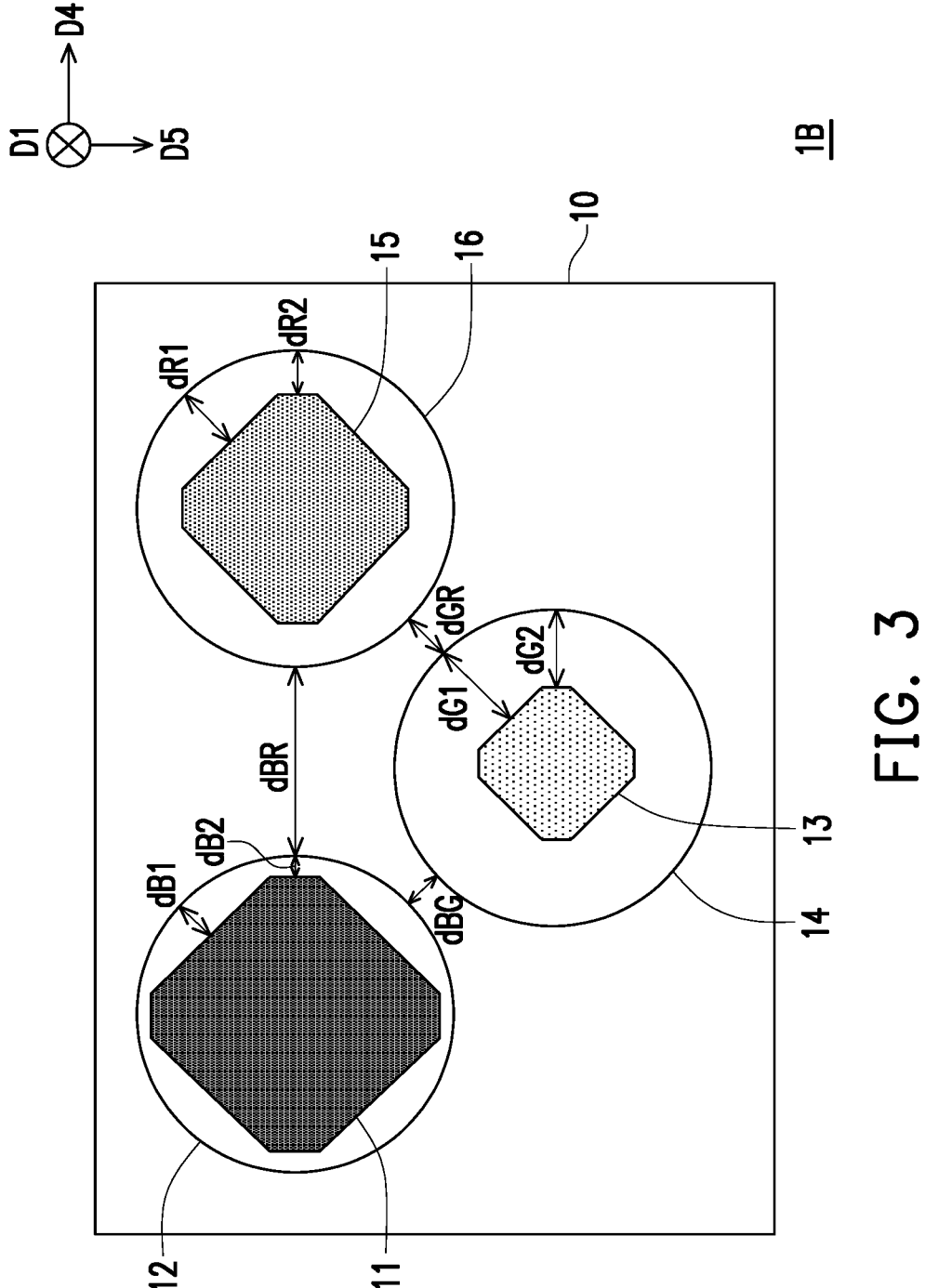
FIG. 3 to FIG. 7 are respectively partial top schematic diagrams of display devices according to a plurality of embodiments of the disclosure.

Referring to FIG. 3, a display device 1B may include the substrate 10, the first light-emitting unit 11, a second light-emitting unit 13, a third light-emitting unit 15, the first lens 12, a second lens 14, and a third lens 16. The first light-emitting unit 11 is disposed on the substrate 10 and configured to emit a blue light beam LB (not shown in FIG. 3, please refer to FIG. 10), for example. The second light-emitting unit 13 is disposed on the substrate 10 and adjacent to the first light-emitting unit 11. For example, the second light-emitting unit 13 is configured to emit a green light beam LG (not shown in FIG. 3, please refer to FIG. 10). The third light-emitting unit 15 is disposed on the substrate 10 and adjacent to the second light-emitting unit 13. For example, the third light-emitting unit 13 is configured to emit a red light beam LR (not shown in FIG. 3, please refer to FIG. 10). The first lens 12 is disposed on the first light-emitting unit 11 and configured to receive at least a portion of the blue light beam. The second lens 14 is disposed on the second light-emitting unit 13 and configured to receive at least a portion of the green light beam. The third lens 16 is disposed on the third light-emitting unit 15 and configured to receive at least a portion of the red light beam.

As shown in FIG. 3, the first lens 12, the second lens 14, and the third lens 16 are respectively disposed corresponding to the first light-emitting unit 11, the second light-emitting unit 13, and the third light-emitting unit 15. That is, the first lens 12, the second lens 14, and the third lens 16 are respectively at least partially overlapped with the first light-emitting unit 11, the second light-emitting unit 13, and the third light-emitting unit 15 in the top view direction (e.g., the direction D1) of the display device 1B.

In some embodiments, any one, two, or three of the combination of the first light-emitting unit 11 and the first lens 12, the combination of the second light-emitting unit 13 and the second lens 14, and the combination of the third light-emitting unit 15 and the third lens 16 may adopt any of the designs described in FIG. 1 or FIG. 2 (such as refractive index limit, range of d, range of R≥L, or T/d, etc.) to improve light extraction efficiency, but the disclosure is not limited thereto.

Figure 8:
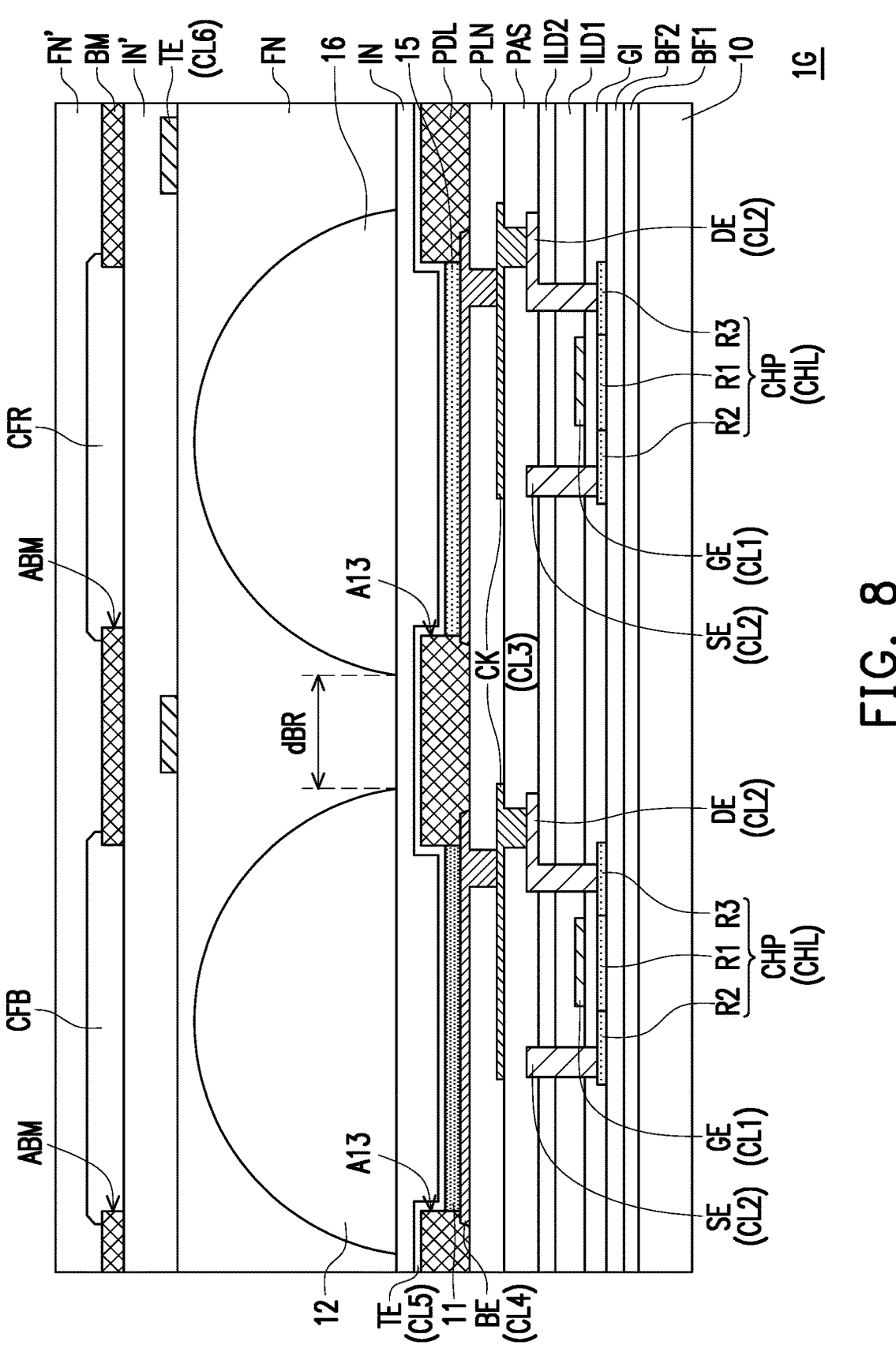
Figure 9:
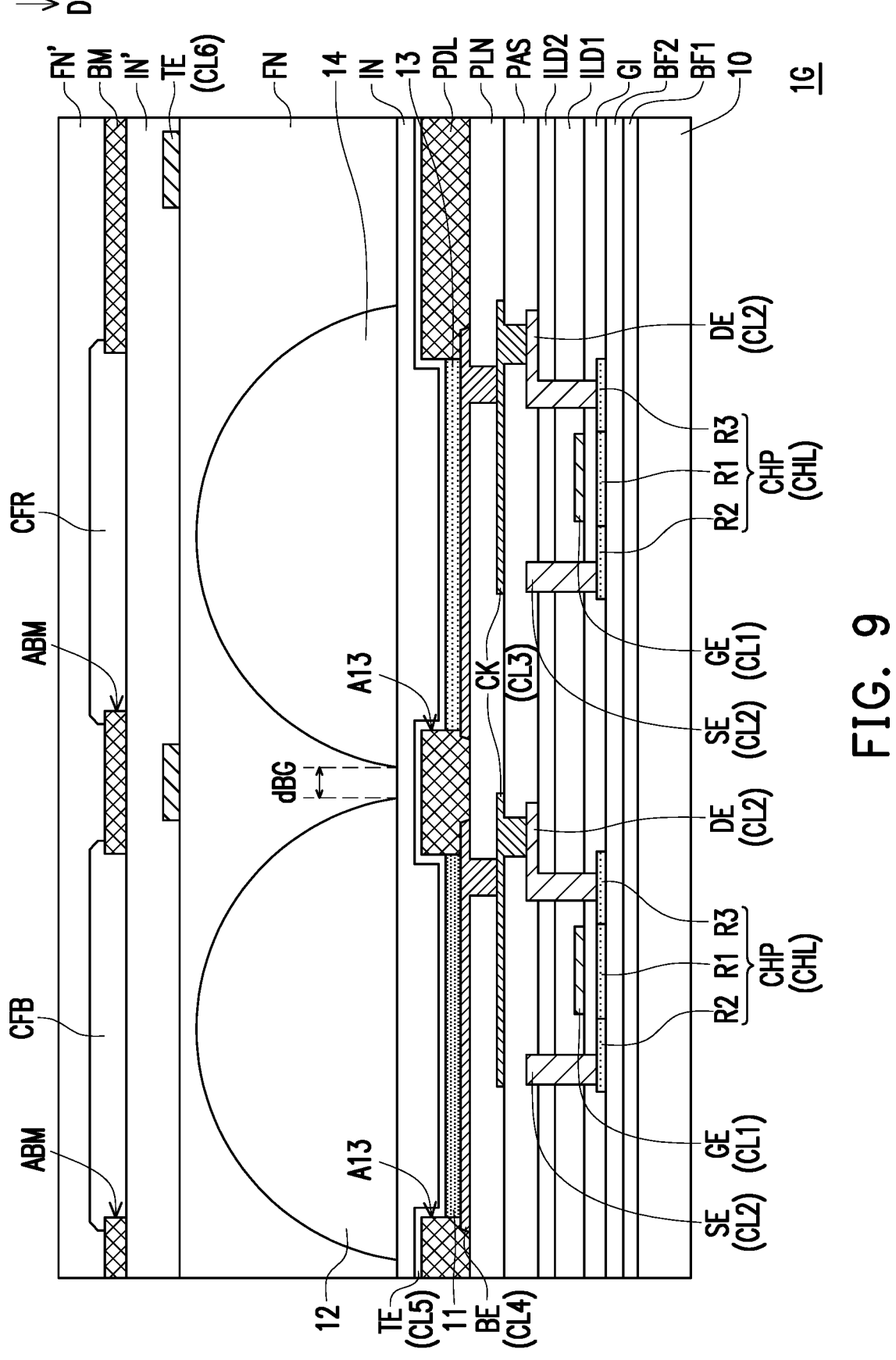

It should be understood that, although FIG. 3 schematically shows one first light-emitting unit 11, one second light-emitting unit 13, one third light-emitting unit 15, one first lens 12, one second lens 14, and one third lens 16, the display device 1B may include a plurality of each of the above elements. For example, a plurality of first light-emitting units 11 and a plurality of third light-emitting units 15 may be alternately arranged in a direction D4 and a direction D5, a plurality of second light-emitting units 13 may be arranged in the direction D4 and the direction D5, and the plurality of second light-emitting units 13 are arranged alternately with the plurality of first light-emitting units 11 and the plurality of third light-emitting units 15, for example. That is, the second light-emitting units 13 are not aligned with the first light-emitting units 11 and the third light-emitting units 15 in the direction D4 and the direction D5. Under this architecture, a distance dBR between the first lens 12 and the third lens 16 is, for example, greater than a distance dBG between the first lens 12 and the second lens 14, and the distance dBR between the first lens 12 and the third lens 16 is, for example, greater than a distance dGR between the second lens 14 and the third lens 16. The distance between two lenses (such as the distance dBR, the distance dBG, the distance dGR) refers to the smallest distance between the two lenses. As shown in FIG. 8, the distance dBR is the smallest distance between the first lens 12 and the third lens 16 on the cross section; as shown in FIG. 9, the distance dBG is the smallest distance between the first lens 12 and the second lens 14 on the cross section. In some embodiments, the distance dBG and/or the distance dGR may be greater than or equal to 0. In addition, the number and arrangement relationship of the first lens 12, the second lens 14, and the third lens 16 may be changed corresponding to the first light-emitting unit 11, the second light-emitting unit 13, and the third light-emitting unit 15. The above arrangement design helps to reduce the number of required pixels while achieving high-resolution effects, or helps to improve visual brightness or reduce process costs.

In other embodiments, although not shown, the second light-emitting unit 13 may be aligned with the first light-emitting unit 11 and the third light-emitting unit 15 in the direction D4 (or the direction D5), and the second light-emitting unit 13 may be misaligned with the first light-emitting unit 11 and the third light-emitting unit 15 in the direction D5 (or the direction D4).

Figure 4:
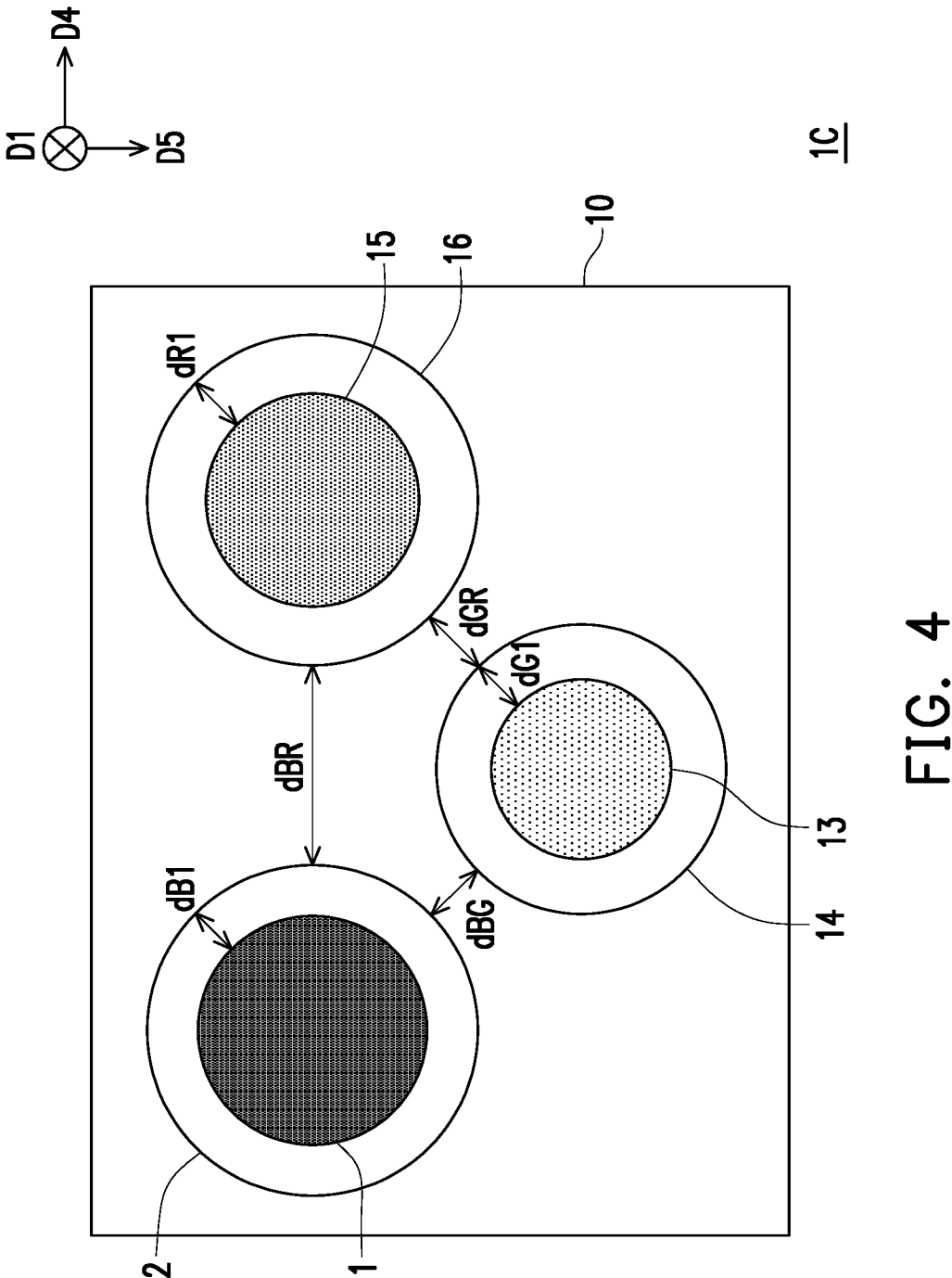

In some embodiments, as shown in FIG. 3, the top view shapes of the first light-emitting unit 11, the second light-emitting unit 13, and the third light-emitting unit 15 may be polygonal (such as octagonal), and the top view shapes of the first lens 12, the second lens 14, and the third lens 16 may be circular, but the disclosure is not limited thereto. For example, in other embodiments, the top view shapes of the first light-emitting unit 11, the second light-emitting unit 13, and the third light-emitting unit 15 may also be circular (as shown in FIG. 4) or other polygon shapes.

When the top view shape of the light-emitting unit is polygonal, and the top view shape of the lens is circular, there may be a plurality of different distances d between each light-emitting unit and the corresponding lens (the distance between the edge of the light-emitting unit and the edge of the lens). For example, there may be a distance dB1 and a distance dB2 between the first light-emitting unit 11 and the first lens 12, wherein the distance dB1 is greater than the distance dB2; there may be a distance dG1 and a distance dG2 between the second light-emitting unit 13 and the second lens 14, wherein the distance dG1 is greater than the distance dG2; there may be a distance dR1 and a distance dR2 between the third light-emitting unit 15 and the third lens 16, wherein the distance dR1 is greater than the distance dR2.

In some embodiments, as shown in FIG. 3, the areas of the first light-emitting unit 11, the second light-emitting unit 13, and the third light-emitting unit 15 may be different. For example, the area of the first light-emitting unit 11 may be greater than the area of the third light-emitting unit 15, and the area of the third light-emitting unit 15 may be greater than the area of the second light-emitting unit 13, but the disclosure is not limited thereto. For example, in other embodiments, the areas of at least two of the first light-emitting unit 11, the second light-emitting unit 13, and the third light-emitting unit 15 may be the same.

In some embodiments, as shown in FIG. 3, the areas of the first lens 12, the second lens 14, and the third lens 16 may be the same, but the disclosure is not limited thereto. For example, in other embodiments, the areas of at least two of the first lens 12, the second lens 14, and the third lens 16 may be different.

Referring to FIG. 4, the main differences between a display device 1C and the display device 1B in FIG. 3 will be described later. In the display device 1C, the first light-emitting unit 11, the second light-emitting unit 13, the third light-emitting unit 15, the first lens 12, the second lens 14, and the third lens 16 are all circular in top view, for example, and there is the distance d between each light-emitting unit and the corresponding lens (the distance between the edge of the light-emitting unit and the edge of the lens), wherein the distance dB1 is equal to the distance dG1 and the distance dR1 to improve the uniformity of light mixing. In addition, the area of the first lens 12 is greater than the area of the third lens 16, and the area of the third lens 16 is greater than the area of the second lens 14.

In other embodiments, although not shown, the first lens 12, the second lens 14, and the third lens 16 may have the same area to improve process convenience. Under this architecture, the area of the first light-emitting unit 11 may be greater than the area of the third light-emitting unit 15, and the area of the third light-emitting unit 15 may be greater than the area of the second light-emitting unit 13, so that the distance dB1 is smaller than the distance dR1, and the distance dR1 is smaller than the distance dG1.

Moreover, when the first light-emitting unit 11 and the first lens 12 are not overlapped at the center point, there may be a plurality of different distances d (distances between the edge of the light-emitting unit and the edge of the lens) between the first light-emitting unit 11 and the first lens 12. For example, the distance between the first light-emitting unit 11 and the first lens 12 may have the distance dB1 and the distance dB2, wherein the distance dB1 is different from the distance dB2.

Figure 5:
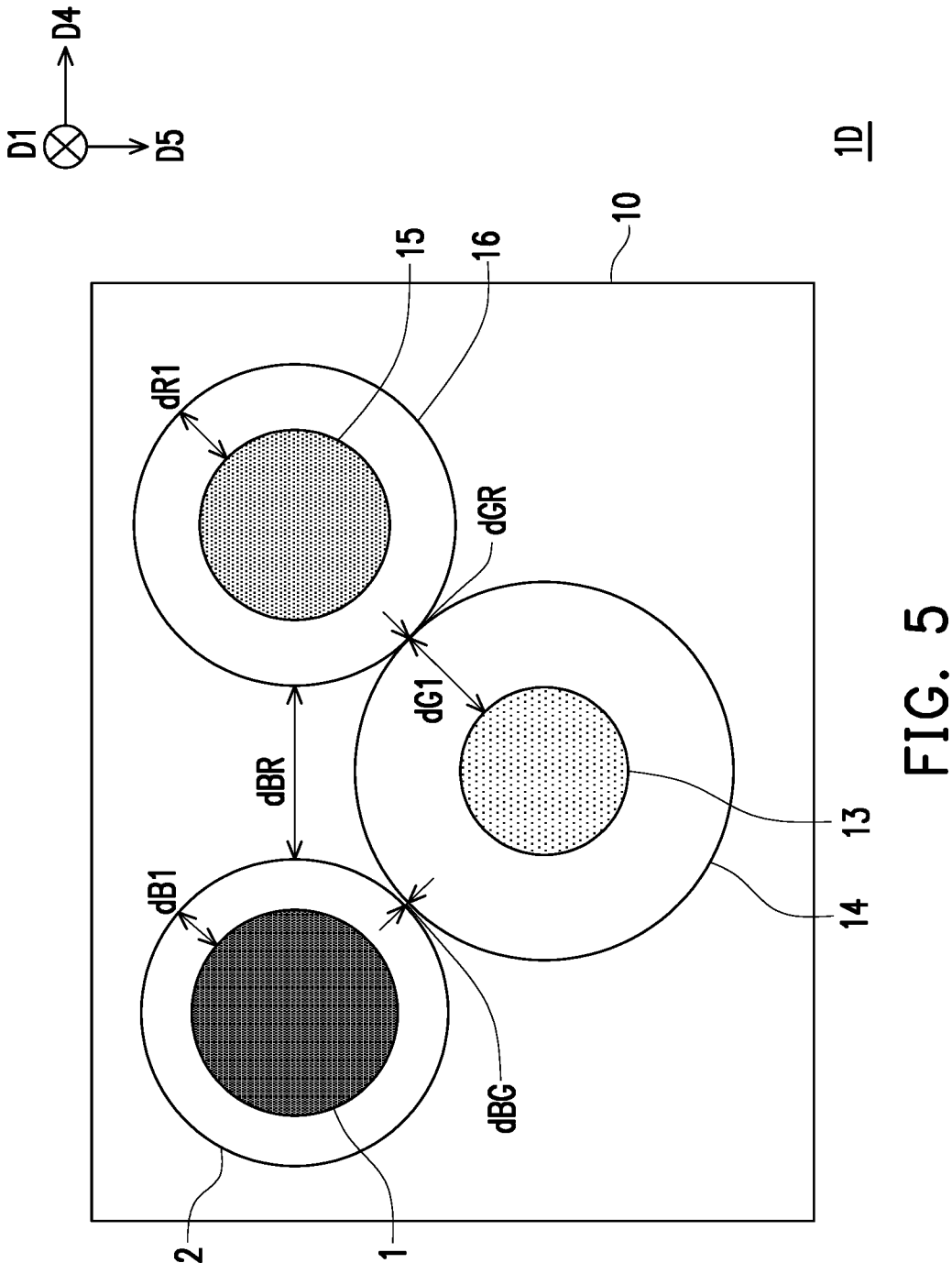

Referring to FIG. 5, the main differences between a display device 1D and the display device 1C in FIG. 4 will be described later. In the display device 1D, the area of the second light-emitting unit 13 is smaller than the area of the third light-emitting unit 15, and the area of the third light-emitting unit 15 is smaller than the area of the first light-emitting unit 11; in addition, the area of the second lens 14 is greater than the area of the third lens 16, and the area of the third lens 16 is greater than the area of the first lens 12, so that the distance dG1 is greater than the distance dR1, and the distance dR1 is greater than the distance dB1. Under this architecture, the extraction rate of green light may be improved.

Figure 6:
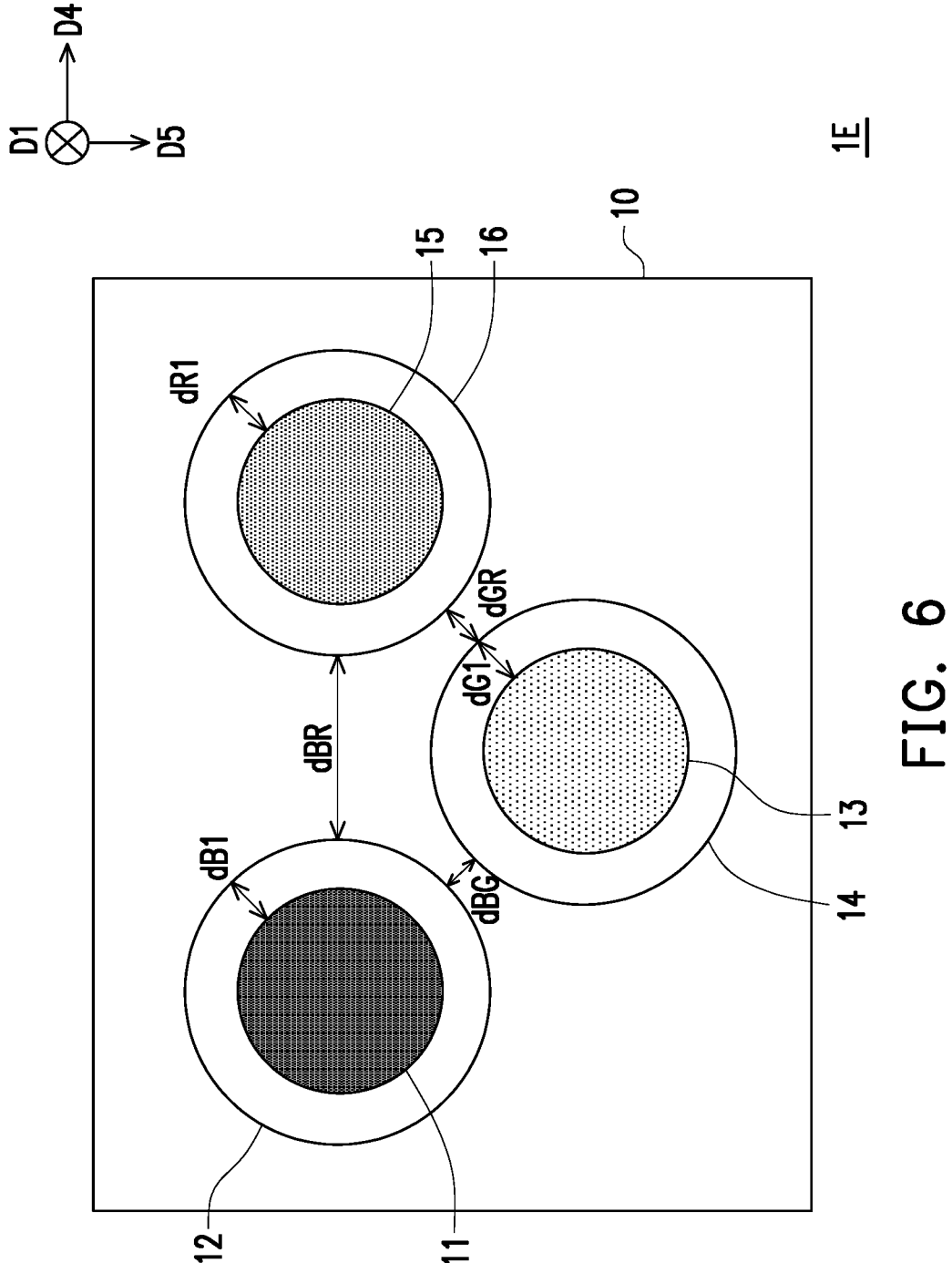

Referring to FIG. 6, the main differences between a display device 1E and the display device 1C in FIG. 4 will be described later. In the display device 1E, the distance dB1 is equal to the distance dG1 and the distance dR1, and furthermore the first lens 12, the second lens 14, and the third lens 16 have the same area, and the first light-emitting unit 11, the second light-emitting unit 13, and the third light-emitting unit 15 also have the same area, so as to improve process convenience.

Figure 7:
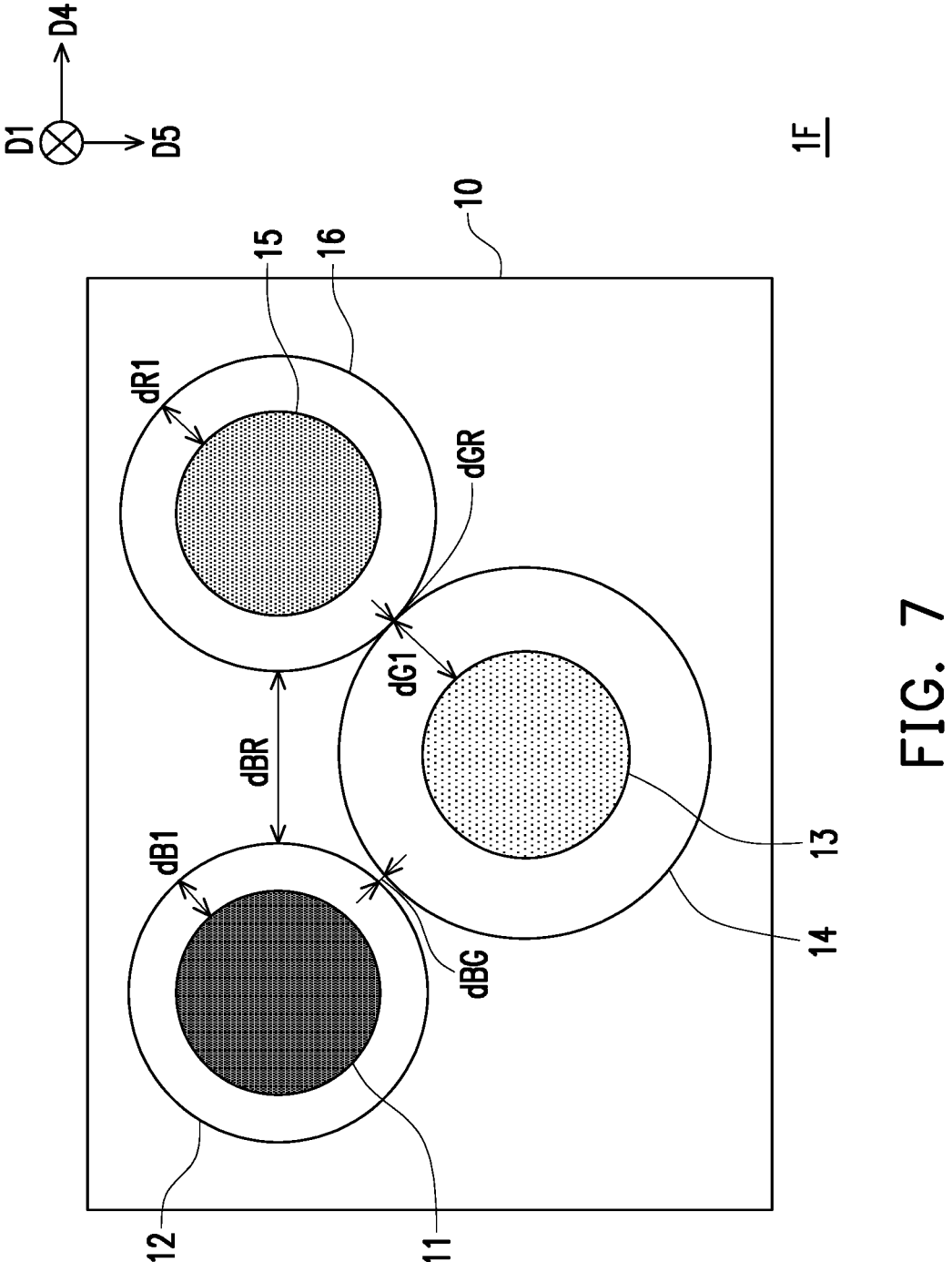

Referring to FIG. 7, the main differences between a display device 1F and the display device 1C in FIG. 4 will be described later. In the display device 1F, the first light-emitting unit 11, the second light-emitting unit 13, and the third light-emitting unit 15 have the same area, the area of the second lens 14 is greater than the area of the third lens 16, and the area of the third lens 16 is greater than the area of the first lens 12, so that the distance dB1 is smaller than the distance dR1, and the distance dR1 is smaller than the distance dG1.

Referring to FIG. 8 or FIG. 9, a display device 1G includes, for example, the substrate 10, a buffer layer BF1, a buffer layer BF2, a semiconductor layer CHL, a gate insulating layer GI, a conductive layer CL1, a dielectric layer ILD1, a dielectric layer ILD2, a conductive layer CL2, a passivation layer PAS, a conductive layer CL3, a planar layer PLN, a conductive layer CL4, the pixel definition layer PDL, the first light-emitting unit 11, the second light-emitting unit 13, the third light-emitting unit 15, a conductive layer CL5, the insulating layer IN, the first lens 12, the second lens 14, the third lens 16, the filling layer FN, a conductive layer CL6, an insulating layer IN', a light-shielding layer BM, a color filter layer CFR, a color filter layer CFG, a color filter layer CFB, and a filling layer FN', but the disclosure is not limited thereto. According to different requirements, the display device 1G may include or omit one or a plurality of elements or film layers.

The buffer layer BF1 and the buffer layer BF2 are sequentially disposed on the substrate 10. For example, the material of the buffer layer BF1 and the buffer layer BF2 may include an inorganic material, such as silicon oxide or silicon nitride, but the disclosure is not limited thereto.

The semiconductor layer CHL is disposed on the buffer layer BF2. For example, the material of the semiconductor layer CHL includes an oxide semiconductor material, such as indium gallium zinc oxide (IGZO), but the disclosure is not limited thereto. In other embodiments, the material of the semiconductor layer 18 may include amorphous silicon, polysilicon, metal oxide, or a combination thereof. The semiconductor layer CHL is, for example, a patterned semiconductor layer and may include a plurality of semiconductor patterns CHP. The semiconductor patterns CHP may include a channel region R1, a source region R2, and a drain region R3, wherein the channel region R1 is located between the source region R2 and the drain region R3.

The gate insulating layer GI is disposed on the semiconductor layer CHL and covers the buffer layer BF2 exposed by the semiconductor layer CHL. For example, the material of the gate insulating layer GI may include an inorganic material, such as silicon oxide or silicon nitride, but the disclosure is not limited thereto.

The conductive layer CL1 is disposed on the gate insulating layer GI. For example, the material of the conductive layer CL1 includes a metal or a metal stack, such as aluminum, molybdenum, or titanium/aluminum/titanium. The conductive layer CL1 is, for example, a patterned conductive layer and may include a plurality of gates GE, a plurality of signal lines (not shown), etc., but the disclosure is not limited thereto. The plurality of gates GE are respectively disposed above a plurality of channel regions R1.

The dielectric layer ILD1 and the dielectric layer ILD2 are sequentially disposed on the conductive layer CL1 and cover the gate insulating layer GI exposed by the conductive layer CL1. For example, the material of the dielectric layer ILD1 and the dielectric layer ILD2 may include an inorganic material, such as silicon oxide or silicon nitride, but the disclosure is not limited thereto. In some embodiments, although not shown, one of the dielectric layer ILD1 and the dielectric layer ILD2 may be omitted.

The conductive layer CL2 is disposed on the dielectric layer ILD2. For example, the material of the conductive layer CL2 includes a metal or a metal stack, such as aluminum, molybdenum, or titanium/aluminum/titanium. The conductive layer CL2 is, for example, a patterned conductive layer and may include a plurality of sources SE, a plurality of drains DE, a plurality of signal lines (not shown), etc., but the disclosure is not limited thereto. The sources SE penetrate the dielectric layer ILD1 and the dielectric layer ILD2 to be connected to the gate insulating layer GI and to the source region R2. The drains DE penetrate the dielectric layer ILD1 and the dielectric layer ILD2 to be connected to the drain region R3.

Each of the gates GE, one corresponding semiconductor pattern CHP, one corresponding source SE, and one corresponding drain DE form one active element. According to some embodiments, the active element may be, for example, a thin-film transistor. The display device 1G may include a plurality of active elements. The material of the semiconductor layer CHL included in the plurality of active elements may be the same or different. According to some embodiments, the plurality of active elements may include an active element having amorphous silicon, an active element having polysilicon, an active element having a metal oxide, or a combination thereof.

The passivation layer PAS is disposed on the conductive layer CL2 and covers the dielectric layer ILD2 exposed by the conductive layer CL2. For example, the material of the passivation layer PAS may include an inorganic material, such as silicon oxide or silicon nitride, but the disclosure is not limited thereto.

The conductive layer CL3 is disposed on the passivation layer PAS. For example, the material of the conductive layer CL3 includes a metal or a metal stack, such as aluminum, molybdenum, or titanium/aluminum/titanium. The conductive layer CL3 is, for example, a patterned conductive layer and may include a plurality of circuits CK, etc., but the disclosure is not limited thereto. The circuits CK penetrate the passivation layer PAS and are connected to the drain DE.

The planar layer PLN is disposed on the conductive layer CL3 and covers the passivation layer PAS exposed by the conductive layer CL3. For example, the material of the planar layer PLN includes an organic material or a polymer material, such as polymethyl methacrylate, epoxy resin, acrylic-based resin, silicone, polyimide polymer, or a combination of the above, but the disclosure is not limited thereto. In some embodiments, although not shown, a plurality of planar layers may be disposed between the conductive layer CL3 and the conductive layer CL4.

The conductive layer CL4 is disposed on the planar layer PLN. For example, the material of the conductive layer CL4 includes a metal or a metal stack, such as aluminum, molybdenum, or titanium/aluminum/titanium. The conductive layer CL4 is, for example, a patterned conductive layer and may include a plurality of lower electrodes BE, etc., but the disclosure is not limited thereto. The lower electrodes BE penetrate the planar layer PLN and are connected to the circuits CK.

The pixel definition layer PDL is disposed on the planar layer PLN and covers the edge of the lower electrodes BE. The pixel definition layer PDL may have a plurality of openings A13. The plurality of openings A13 respectively expose the plurality of lower electrodes BE.

The first light-emitting unit 11, the second light-emitting unit 13, and the third light-emitting unit 15 are respectively disposed in the plurality of openings A13 and cover the lower electrodes BE. For the related descriptions of the first light-emitting unit 11, the second light-emitting unit 13, and the third light-emitting unit 15, please refer to the above, which will not be repeated herein.

The conductive layer CL5 is disposed on the pixel definition layer PDL and covers the first light-emitting unit 11, the second light-emitting unit 13, and the third light-emitting unit 15. For example, the material of the conductive layer CL5 includes a transparent conductive material, such as metal oxide, nano-silver, or graphene, but the disclosure is not limited thereto. The conductive layer CL5 includes, for example, a top electrode TE, and the top electrode TE is, for example, an entire conductive layer.

The insulating layer IN is disposed on the conductive layer CL5. Please refer to the above description for the related description of the insulating layer IN, which will not be repeated herein.

The first lens 12, the second lens 14, and the third lens 16 are disposed on the insulating layer IN and corresponding to the first light-emitting unit 11, the second light-emitting unit 13, and the third light-emitting unit 15, respectively. For the related descriptions of the first lens 12, the second lens 14, and the third lens 16, please refer to the above, which will not be repeated herein.

The filling layer FN is disposed on the insulating layer IN and covers the first lens 12, the second lens 14, and the third lens 16. Please refer to the above description for the related description of the filling layer FN, which will not be repeated herein.

The conductive layer CL6 is disposed on the filling layer FN. For example, the material of the conductive layer CL6 includes a metal or a metal stack, such as aluminum, molybdenum, or titanium/aluminum/titanium. The conductive layer CL6 is, for example, a patterned conductive layer and may include a plurality of touch electrodes TH, etc., but the disclosure is not limited thereto.

The insulating layer IN' is disposed on the conductive layer CL6 and covers the filling layer FN exposed by the conductive layer CL6. For example, the material of the insulating layer IN' may include an inorganic material, an organic material, or a combination thereof. The inorganic material may include, but not limited to, silicon oxide or silicon nitride. The organic material may include polymethyl methacrylate, epoxy resin, acrylic resin, silicone, polyimide polymer, or a combination of the above, but the disclosure is not limited thereto.

The light-shielding layer BM is disposed on the insulating layer IN'. The light-shielding layer BM may include a layer having a transmittance of less than 50% for light in the visible light waveband (light with a wavelength of 400 nm to 700 nm). For example, the material of the light-shielding layer BM may include a photoresist material added with light absorbing particles (e.g., carbon black), but the disclosure is not limited thereto. In some embodiments, the material of the light-shielding layer BM may include a black matrix, but the disclosure is not limited thereto. The light-shielding layer BM has a plurality of openings ABM. The plurality of openings ABM are respectively overlapped with the first lens 12, the second lens 14, and the third lens 16 in the direction D1.

The color filter layer CFR, the color filter layer CFG, and the color filter layer CFB are respectively disposed in the plurality of openings ABM, wherein the color filter layer CFR is disposed on the third lens 16, the color filter layer CFG is disposed on the second lens 14, and the color filter layer CFB is disposed on the first lens 12. The color filter layer CFR allows the red light beam to pass through and filters the remaining color light beams. The color filter layer CFG allows green light beam to pass through and filters the remaining color light beams. The color filter layer CFB allows blue light beam to pass through and filters the remaining color light beams.

The filling layer FN' is disposed on the color filter layer CFR, the color filter layer CFG, and the color filter layer CFB and covers the light-shielding layer BM. For example, the material of the filling layer FN' may include a polymer material, such as an acrylic-based polymer, a siloxane-based polymer, or an epoxy-based polymer, but the disclosure is not limited thereto.

In the display device 1G, the distance dBR between the first lens 12 and the third lens 16 is, for example, greater than the distance dBG between the first lens 12 and the second lens 14. This design helps to reduce the number of pixels required while achieving high-resolution effects, or helps to improve visual brightness or reduce process costs.

Figure 10:
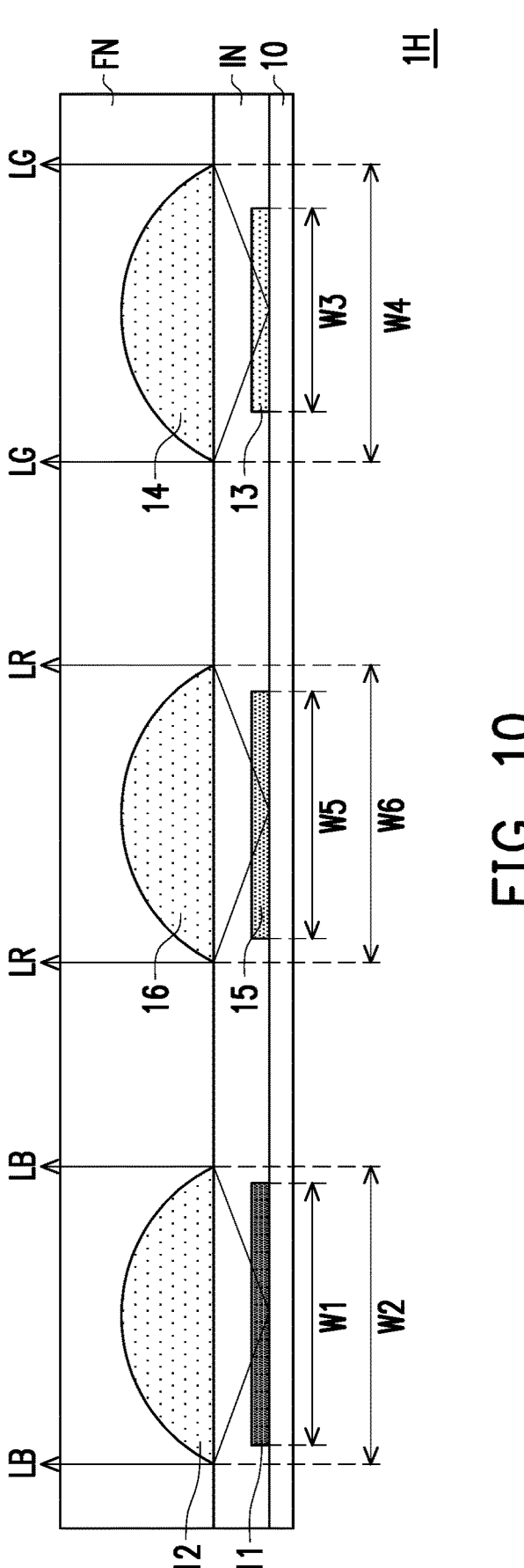

Referring to FIG. 10, in a display device 1H, the first light-emitting unit 11 has the first width W1, the first lens 12 has the second width W2, the second light-emitting unit 13 has a third width W3, the second lens 14 has a fourth width W4, the third light-emitting unit 15 has a fifth width W5, and the third lens 16 has a sixth width W6. Each of the widths is measured on a cross-section passing through the center of the first lens 12 in which the light-emitting region has the largest width. The width of the light-emitting unit (e.g., the first width W1, the third width W3, and the fifth width W5) is defined as the width of the light-emitting region in the light-emitting unit on the cross section. Taking an organic light-emitting diode as an example, the width of the light-emitting unit is the bottom width of the openings A13 of the pixel definition layer PDL. Taking a light-emitting diode as an example, the width of the light-emitting unit is the width of a multiple quantum well layer. The widths of the lenses (e.g., the second width W2, the fourth width W4, and the sixth width W6) are the bottom widths of the lenses on the cross section.

If the display device 1H satisfies: $|W4-W3|>|W6-W5|>|W2-W1|$, the light extraction efficiency of the green light beam LG may be improved.

It should be understood that the display device 1H may further include one or a plurality of film layers or elements as shown in FIG. 8 or FIG. 9 according to different requirements, and details are not repeated herein.

Figure 11:
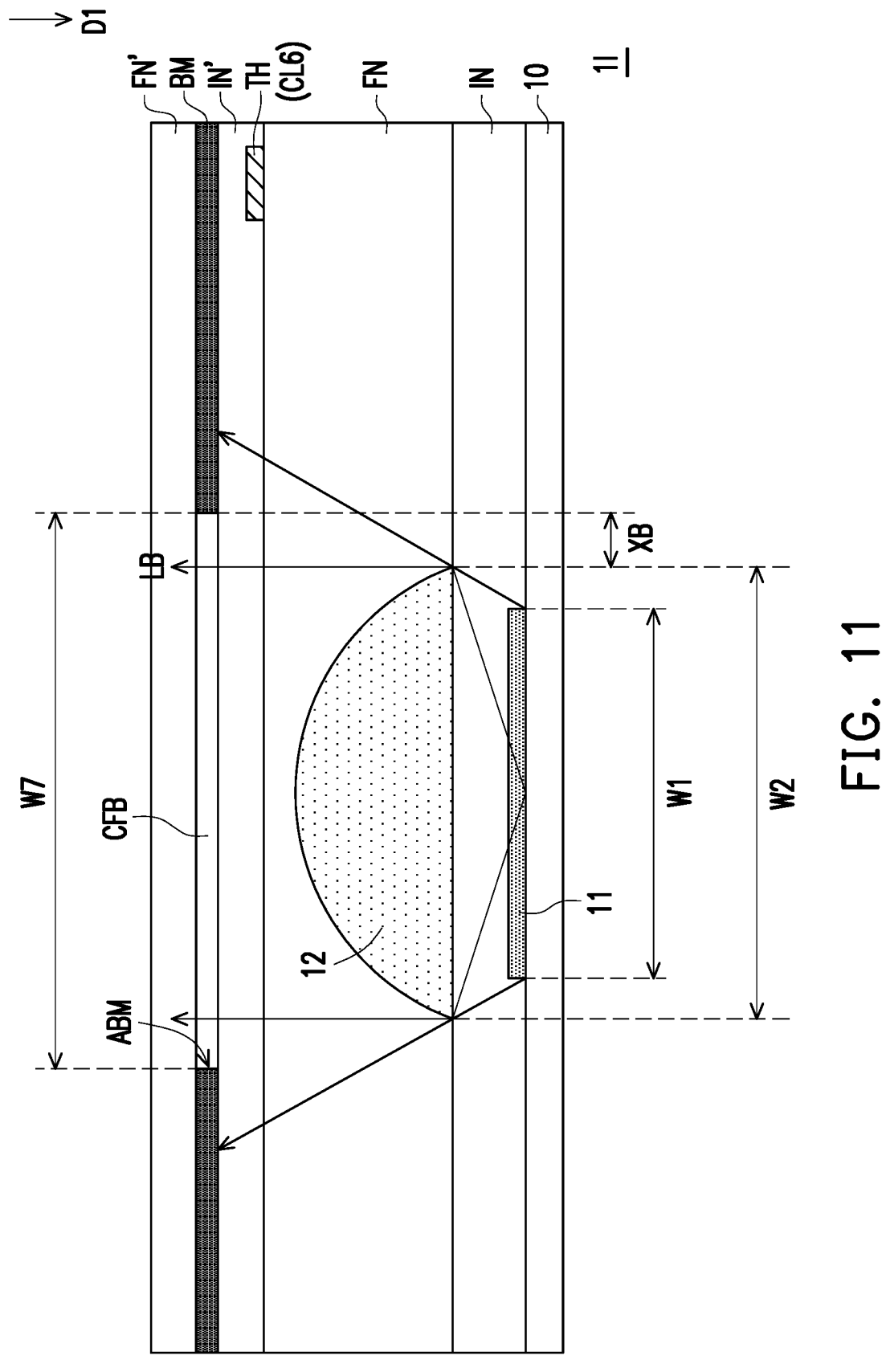

Referring to FIG. 11, in a display device II, the first light-emitting unit 11 has the first width W, the first lens 12 has the second width W2, and the color filter layer CFB has a seventh width W7. The seventh width W7 is the largest width of the color filter layer CFB on the cross section.

If the display device II satisfies: $W7>W2>W1$, the distance between the first lens 12 and the color filter layer CFB in the direction D1 may be reduced, thereby helping to improve light extraction efficiency. It should be understood that the light-emitting unit of any color and the corresponding lens and color filter layer thereof may also be changed accordingly, which will not be repeated herein. Moreover, when the red, green, and blue color filter layers of are all changed in this way, a shortest distance XB between the edge of the blue filter layer (such as the color filter layer CFB) and the edge of the first lens 12 on the cross section may be greater than the shortest distance (not shown) between the edge of the red filter layer (the color filter layer CFR shown in FIG. 8) and the edge of the third lens 16 on the cross section, and the shortest distance between the edge of the red filter layer (the color filter layer CFR shown in FIG. 10) and the edge of the third lens 16 on the cross section may be greater than the shortest distance (not shown) between the edge of the green filter layer (the color filter layer CFG shown in FIG. 9) and the edge of the second lens 14 on the cross section. Alternatively, the three shortest distances may be the same.

In an embodiment of the disclosure, the light extraction efficiency of the display device may be improved via the design of the aforementioned plurality of conditional expressions. Moreover, by designing the distances between the plurality of lenses disposed corresponding to the light-emitting units of different colors, the required number of pixels may be reduced while achieving a high-resolution effect, or visual brightness may be improved or process costs may be reduced.

The above embodiments are used to describe the technical solutions of the disclosure instead of limiting them. Although the disclosure has been described in detail with reference to each embodiment above, those having ordinary skill in the art should understand that the technical solution recited in each embodiment above may still be modified, or some or all of the technical features thereof may be equivalently replaced. These modifications or replacements do not make the essence of the corresponding technical solutions depart from the scope of the technical solution of each embodiment of the disclosure.

Although the embodiments of the disclosure and their advantages are disclosed as above, it should be understood that any person with ordinary skill in the art, without departing from the spirit and scope of the disclosure, may make changes, substitutions, and modifications, and features between the embodiments may be mixed and replaced at will to form other new embodiments. In addition, the scope of the disclosure is not limited to the manufacturing processes, machines, manufactures, material compositions, devices, methods, and steps in the specific embodiments described in the specification. Any person with ordinary skill in the art may understand the current or future development processes, machines, manufactures, material compositions, devices, methods, and steps from the content of the disclosure, which may all be adopted according to the disclosure as long as they may implement substantially the same function or obtain substantially the same result in an embodiment described here. Therefore, the scope of the disclosure includes the above manufacturing processes, machines, manufactures, material compositions, devices, methods, and steps. In addition, each claim constitutes an individual embodiment, and the scope of the disclosure also includes the combination of each claim and embodiment. The scope of the disclosure shall be subject to the scope defined by the following claims.

What is claimed is:

1. A display device, comprising:
   a substrate;
   a first light-emitting unit disposed on the substrate and configured to emit a first light beam; and
   a first lens disposed on the first light-emitting unit and configured to receive at least a portion of the first light beam,
   wherein in a cross-sectional view of the display device, the first light-emitting unit has a first width W1, the first lens has a second width W2, the first lens has a height L, the first lens has a radius of curvature R, a distance between the first lens and the first light-emitting unit is T, and the display device satisfies:

$$\frac{T}{(W2-W1)/2} \le \frac{57.29 + \dfrac{2*(R-L)}{W_2}}{1 - \dfrac{114.58*(R-L)}{W_2}};$$

$0.1\ \mu m \le (W2-W1)/2 \le 30\ \mu m;$ and $R \ge L.$

2. The display device of claim 1, further satisfying:

$0.5\ \mu m \le (W2-W1)/2 \le 15\ \mu m.$

3. The display device of claim 2, further satisfying:

$0.5\ \mu m \le (W2-W1)/2 \le 9.5\ \mu m.$

4. The display device of claim 1, further satisfying:

$0 < L \le 0.75R.$

5. A display device, comprising:
a substrate;
a first light-emitting unit disposed on the substrate and configured to emit a blue light beam;
a second light-emitting unit disposed on the substrate and adjacent to the first light-emitting unit, and the second light-emitting unit is configured to emit a green light beam;
a third light-emitting unit disposed on the substrate and adjacent to the second light-emitting unit, and the third light-emitting unit is configured to emit a red light beam;
a first lens disposed on the first light-emitting unit and configured to receive at least a portion of the blue light beam;
a second lens disposed on the second light-emitting unit and configured to receive at least a portion of the green light beam; and
a third lens disposed on the third light-emitting unit and configured to receive at least a portion of the red light beam, wherein a distance between the first lens and the third lens is greater than a distance between the first lens and the second lens,
wherein in a cross-sectional view of the display device, the first light-emitting unit has a first width W1, the first lens has a second width W2, the first lens has a height L, the first lens has a radius of curvature R, a distance between the first lens and the first light-emitting unit is T, and the display device satisfies:

$$\frac{T}{(W2-W1)/2} \le \frac{57.29 + \dfrac{2*(R-L)}{W_2}}{1 - \dfrac{114.58*(R-L)}{W_2}};$$

$0.1\ \mu m \le (W2-W1)/2 \le 30\ \mu m;$ and $R \ge L.$

6. The display device of claim 5, further satisfying:

$0.5\ \mu m \le (W2-W1)/2 \le 15\ \mu m.$

7. The display device of claim 6, further satisfying:

$0.5\ \mu m \le (W2-W1)/2 \le 9.5\ \mu m.$

8. The display device of claim 5, further satisfying:

$0 < L \le 0.75R.$

9. The display device of claim 5, wherein the second light-emitting unit has a third width W3, the second lens has a fourth width W4, the third light-emitting unit has a fifth width W5, the third lens has a sixth width W6, and the display device satisfies:

$|W4-W3| > |W6-W5| > |W2-W1|.$

10. The display device of claim 5, further comprising:
a color filter layer disposed on the first lens, wherein the color filter layer has a seventh width W7, and the display device satisfies:

$W7 > W2 > W1.$

* * * * *